United States Patent [19]
Siaudeau et al.

[11] Patent Number: 5,612,562
[45] Date of Patent: Mar. 18, 1997

[54] SEMICONDUCTOR COMPONENT FOR SUPPLYING, RECIRCULATING AND DEMAGNETIZING AN INDUCTIVE LOAD

[75] Inventors: Jean-Louis Siaudeau, Belcodene; Antoine Pavlin, Puyricard, both of France

[73] Assignee: SGS-Thomson Microelectronics S.A., Saint Genis Pouilly, France

[21] Appl. No.: 528,201

[22] Filed: Sep. 14, 1995

[30] Foreign Application Priority Data

Sep. 30, 1994 [FR] France ................... 94 11975

[51] Int. Cl.$^6$ ................... H01L 23/62
[52] U.S. Cl. ................... 257/328; 257/329; 257/361; 257/362; 361/91; 327/389; 327/432
[58] Field of Search ................... 257/378, 328, 257/329, 355, 356, 362, 361; 327/389, 432; 361/56, 91

[56] References Cited

U.S. PATENT DOCUMENTS

| | | | |
|---|---|---|---|
| 4,255,782 | 3/1981 | Joyce | 363/8 |
| 4,260,908 | 4/1981 | Mings et al. | 307/270 |
| 4,303,841 | 12/1981 | Baker | 257/378 X |
| 4,329,705 | 5/1982 | Baker | 357/403 |
| 4,862,233 | 8/1989 | Matsushita et al. | 357/23.4 |
| 4,916,378 | 4/1990 | Marchio et al. | 323/222 |
| 4,929,884 | 5/1990 | Bird et al. | 323/313 |
| 5,045,902 | 9/1991 | Bancal | 257/328 |
| 5,119,162 | 6/1992 | Todd et al. | 357/43 |
| 5,422,587 | 6/1995 | Pulvirenti et al. | 327/427 |
| 5,465,190 | 11/1995 | Meunier et al. | 361/91 |
| 5,521,414 | 5/1996 | Palara | 257/356 X |

*Primary Examiner*—William Mintel
*Attorney, Agent, or Firm*—David M. Driscoll; James H. Morris

[57] ABSTRACT

A semiconductor component for switching an inductive load, comprises first and second external terminals, first and second control terminals and a node. A vertical bipolar transistor has a base region and is disposed between the first external terminal and the node. A first vertical transistor is disposed between the node and the second external terminal. A zener diode and a second vertical transistor are connected parallel between the base and the node.

20 Claims, 3 Drawing Sheets

SEMICONDUCTOR COMPONENT FOR SUPPLYING, RECIRCULATING AND DEMAGNETIZING AN INDUCTIVE LOAD

BACKGROUND OF THE INVENTION

Field of the Invention

The present invention relates to the fabrication of a monolithic component that performs supply, recirculation and demagnetization functions for an inductive load, utilizing a specific technology for the fabrication of vertical power MOS transistors.

DISCUSSION OF THE RELATED ART

The usual configuration of a circuit for supplying, recirculating and demagnetizing an inductive load is depicted in FIG. 1. The main characteristics of a technology for manufacturing vertical power transistors is shown with relation to FIG. 2.

FIG. 1 represents the conventional configuration of a circuit for supplying, recirculating and demagnetizing an inductive load. In FIG. 1, the load L is connected between a d.c. power supply Vcc and ground through a switch S1. A diode D1 and a switch S2 are serially connected at the terminals of load L. A zener diode Dz is connected in parallel with switch S2.

Three operation phases occur in this circuit:

an excitation phase during which switch S1 is on and the state of switch S2 is unimportant; during this phase, a supply current flows through load L;

a recirculation phase during which switch S1 is off and switch S2 is on; during this phase, the power stored in load L recirculates in the form of a current flowing through the load L, diode D1 and switch S2; and a demagnetization phase during which switches S1 and S2 are off; during this phase, the current continues to recirculate through the diode D1 and zener diode DZ until the inductive load is entirely demagnetized.

FIG. 2 illustrates the technology which the applicant uses to fabricate a circuit providing the functions of the circuit illustrated in FIG. 1. This technology allows the fabrication of circuits comprising vertical MOS (VDMOS) transistors and logic wells in which various MOS logic circuits can be incorporated. This technology is characterized as being very simple, comprising few processing steps, and more particularly few masking and diffusion steps.

FIG. 2 schematically represents power components which can be fabricated in this technology. The left portion of FIG. 2 represents cells of a VDMOS transistor, and the right portion represents a vertical NPN transistor.

In this technology, one starts from a substrate comprising an N-type layer 10 epitaxially formed on an $N^+$-type monocrystalline wafer 11.

During a first doping step, P-type regions are designed to form both logic wells (not shown), in which the logic circuits of the component are fabricated, and, for example, vertical NPN transistor base regions 12, such as the one represented in the right portion of FIG. 2.

During a second doping step, $P^+$ regions having a sufficiently high doping level to obtain ohmic contact with metallizations are formed. Thus, regions 13 which in FIG. 2 correspond to a source contact region of the VDMOS transistor, and to a base contact region of the bipolar transistor, are formed. In the drawings, these highly doped regions are represented by deeper regions.

The gates 15 of the VDMOS transistors and other (not shown) logic transistors are then conventionally formed, for example, through oxidation, polysilicon deposition, etching and reoxidation.

During a third doping step (occurring before the above reoxidation step), low doped P-type regions, masked by the gate of the VDMOS transistors, are formed at the upper periphery of which the channel regions of the VDMOS transistor extend.

During a fourth doping step, highly doped N-type regions are formed. Thus, source regions 17 of the power transistor and emitter regions 18 of bipolar transistors are formed, as well as various source and drain regions (not shown) of logic transistors and contact regions with the substrate.

Lastly, source, drain, base, collector and emitter metallizations are formed at suitable places on the substrate surface. Neither these metallizations nor the oxide regions deposited to insulate superficial portions of the component are referenced in FIG. 2. The metallizations (or polycrystalline layers) are represented in hatched lines. The rear surface of the substrate is uniformly coated with a metallization M1.

Also, additional doping steps may be provided near the components formed in the logic portion, for example, a channel formation step for the depleted MOS transistors.

The operation mode of a VDMOS transistor, which is well known in the art, will not be described. However, it should be noted that, although in FIG. 2 only few cells of a VDMOS transistor are represented, a power VDMOS transistor is generally constituted by a large number of cells, for example, from 100 to over 1000 cells.

Referring again to the portion surrounded by a rectangle drawn in dotted lines of the circuit of FIG. 1, this circuit 1 cannot be fabricated in the form of a monolithic component by using the simple technology described with relation to FIG. 2, especially because the rear surface of the circuit of FIG. 2 is constituted by a highly doped N-type layer 11 entirely coated with metallization M1.

In addition, the circuit of FIG. 1 has some drawbacks. In particular, the presence of a diode D1 connected in series with the switch S2 during the recirculating phase causes a voltage drop across this diode (ranging from 0.6 volt to 0.8 volt), in addition to the voltage drop unavoidably existing across switch S2, which is fabricated in the form of a semiconductor component such as a VDMOS transistor or an NPN bipolar transistor. This voltage drop significantly affects the circuit's consumption.

SUMMARY OF THE INVENTION

An object of the present invention is to fabricate a circuit providing supply, recirculating and demagnetization functions for an inductive load, which avoids the above-mentioned drawbacks and which can be fabricated as a monolithic component.

To achieve these objects, the present invention provides a semiconductor component for switching an inductive load, comprising first and second external terminals; first and second control terminals and a connection node; a vertical bipolar transistor having a base region and disposed between the first external terminal and the node; a first vertical transistor between the node and the second external terminal; and a zener diode and a second vertical transistor which are connected in parallel between the base and the node.

According to one embodiment of the invention, the first and second vertical transistors are MOS transistors.

According to another embodiment of the invention, the component further comprises a lateral MOS transistor whose gate receives a third control voltage and whose source and drain are connected to the second external terminal and to the base of the bipolar transistor, respectively.

According to another embodiment of the invention, the component comprises, on the upper surface of an N-type substrate, whose rear surface is coated with a highly doped N-type region and a metallization: cells of a first vertical MOS transistor having a source connected to the second external terminal and a gate connected to the first control voltage; cells of a second vertical MOS transistor whose gate receives a control voltage; a base region and an emitter region of a vertical bipolar transistor, the emitter region being connected to the first external terminal and the base region being connected to the source of the cells of the second vertical MOS transistor; a P-type well connected to the base region of the vertical bipolar transistor; and an N-type cathode region formed in the P-type well, which constitutes a zener diode with the material of the well, and is connected to the substrate voltage.

According to another embodiment of the invention, the component comprises, on the upper surface of an N-type substrate, whose rear surface is coated with a highly doped N-type region and with a metallization, a base region and an emitter region of a first vertical bipolar transistor, the emitter region being connected to the second external terminal; a base region and an emitter region of a second vertical bipolar transistor; a base region and an emitter region of a third vertical bipolar transistor, the emitter region being connected to the first external terminal and the base region being connected to the emitter region of the second bipolar transistor; a P-type well connected to the base region of the third vertical bipolar transistor; and an N-type cathode region formed in the P-type well, constituting with the material of the well a zener diode, and connected to the substrate voltage.

The foregoing and other objects, features, aspects and advantages of the invention will become apparent from the following detailed description of the present invention when taken in conjunction with the accompanying drawings.

DETAILED DESCRIPTION

Figure 3:
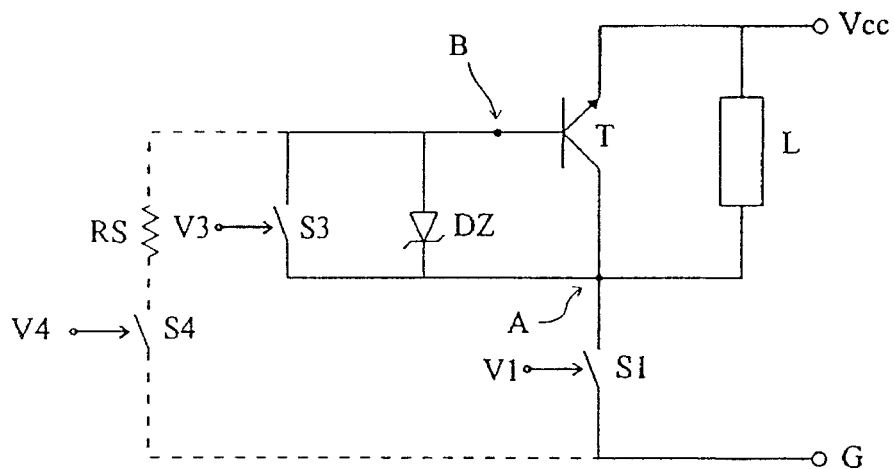
FIG. 3 represents a circuit for supplying, recirculating and demagnetizing a load according to the present invention.

In the circuit of FIG. 3, a load L is connected between a d.c. positive supply source terminal Vcc and a node A of the circuit which is also connected to ground G through a switch S1. An NPN bipolar transistor T, whose emitter is connected to terminal Vcc and collector to terminal A, is connected between terminals A and Vcc. A switch S3, connected in parallel with a zener diode DZ, is disposed between the base B of transistor T and node A. In addition, the circuit may optionally include a switch S4 connected in series with a resistor Rs between node B and ground G.

Figure 1:
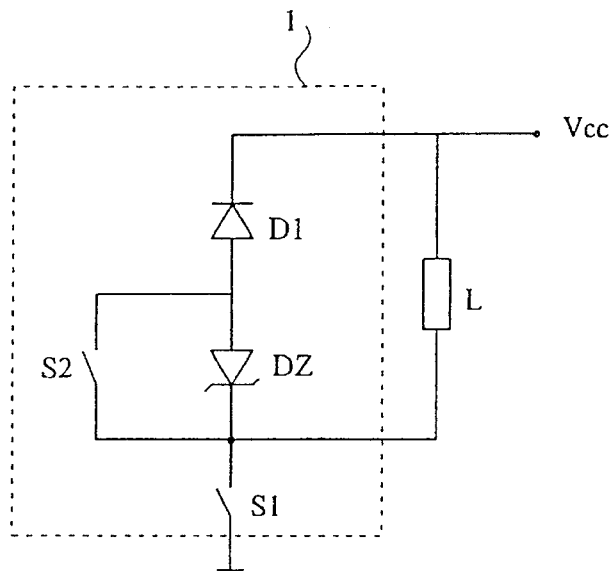
FIG. 1 illustrates a conventional circuit that the present invention aims at fabricating in the form of a monolithic component.

Like the circuit of FIG. 1, the circuit of FIG. 3 operates in one of three phases.

During an excitation phase, switch S1 is on and a supply current flows through load L.

During a recirculating phase, switch S1 is off and switch S3 is on. The current in the load L tends to be held by flowing in the loop initially formed by switch S3 and the base-emitter junction of transistor T. As shown as the loop turns on, transistor T becomes conductive and current flows through the load L and transistor T.

During a demagnetization phase, switches S1 and S3 are off and the current stops to flow as soon as the load is entirely demagnetized.

Preferably, switch S4 is on during the demagnetization phase so that, when the current flow is interrupted in transistor T, the base potential remains fixed.

A first advantage of the circuit illustrated in FIG. 3 is that, during the recirculating phase, the power consumed in the circuit is lower than the power consumed in the circuit of FIG. 1. Indeed, the voltage drop between terminal Vcc and node A corresponds to the base/emitter voltage drop of the bipolar transistor T (approximately 0.7 volt) plus the negligible voltage drop caused by the base current flow through switch S3. In contrast, in the circuit of FIG. 1, the voltage drop in a forward diode (approximately 0.6 to 0.8 volt) should be added to the voltage drop in switch S2 (approximately 0.4 volt for a MOS transistor). Thus, the voltage drop across the elements of the component used for the recirculating is approximately half for a determined current in the case of a circuit according to the present invention than in a prior art circuit. Hence, the surface of the elements of the component assigned to this function can be approximately twice smaller.

Figure 2:
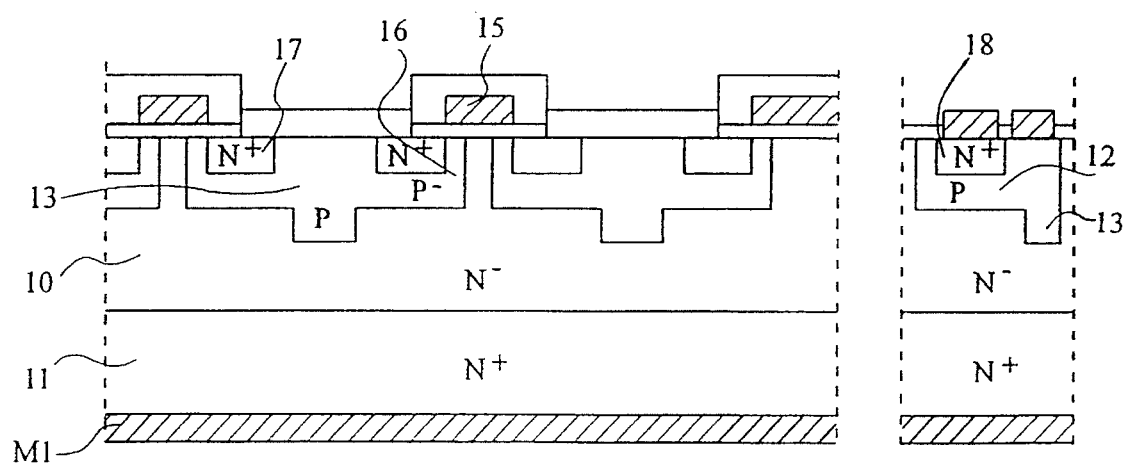
FIG. 2 represents a cross-sectional view of portions of a semiconductor component to illustrate the technology in which the present invention uses in fabricating a circuit providing the functions of the circuit of FIG. 1.

A second advantage of the circuit illustrated in FIG. 3 is that it can be fabricated as a semiconductor monolithic component formed using the technology described with relation to FIG. 2.

Figure 4:
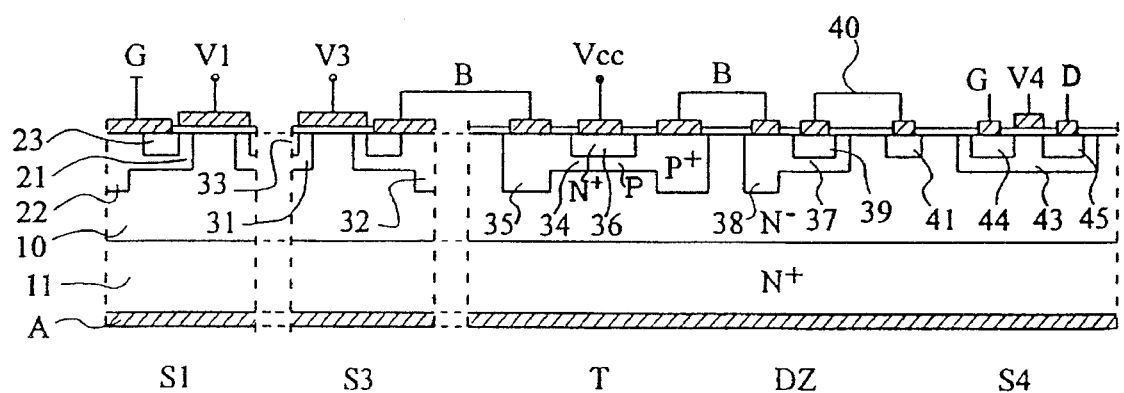
FIG. 4 is a schematic cross-sectional view of a component implementing the circuit of FIG. 3 according to the invention.

FIG. 4 illustrates an exemplary embodiment of such a component. The component is fabricated in an epitaxial layer 10 formed on an $N^+$-type substrate 11 coated with a rear surface metallization which corresponds to the drain of the vertical MOS transistors and to the collectors of the vertical bipolar transistors, i.e., as it will be noted hereinafter, to the connection node A of the circuit of FIG. 3.

The left portion of FIG. 4 represents a portion of a cell of a vertical MOS transistor which has the function of switch S1. This vertical MOS transistor comprises a P-type channel well 21 associated with a more highly doped P-type region 22 and an N-type source region 23. A metallization G contacts regions 22 and 23, and a gate connected to a control voltage source V1 is disposed over the channel region.

A second vertical MOS transistor, including regions 31, 32, 33 corresponding to regions 21, 22, 23, respectively, constitutes the switch S3. The source metallization connected to the base B of transistor T is designated by this reference. The gate is connected to a control voltage source V3.

The bipolar transistor T includes a P-type base region 34 associated with a more highly doped region 35. An emitter region 36 is formed in the base region 34. The region 36 contacts a metallization connected to the voltage source Vcc.

An N-type region 39 is formed in a P-type region 37, which contacts a more highly doped region 38. Region 38 is connected through a metallization B to regions 32 and 35. Region 39 is connected through a metallization 40 to an $N^+$-type region 41 directly formed in substrate 10. Thus, region 39 is conductively connected through substrate 10 and layer 11 to the rear metallization A. Thus, a zener diode, whose cathode is connected to terminal A and whose anode is connected to terminal B, is achieved between regions 39 and 37.

Thus, a structure comprising the components S1, S3, DZ and T connected as illustrated in FIG. 3 is obtained in a simple way. It should be noted that the zener diode DZ has a non-negligible series resistance associated with the thickness of substrate 10. However, this is a small impairment because, in practice, the zener diode DZ is not designed to conduct a high current but only to render the bipolar transistor conductive, if required. This is another advantage of the present invention over the prior art in which the diode DZ should be designed to withstand a non-negligible current flow.

Last, switch S4 can be fabricated in the form of a lateral MOS transistor formed in a P-type well 43 disposed in the substrate 10 and comprising source and drain regions 44 and 45. The source metallization is connected to terminal G, the drain metallization is connected to terminal D and the gate metallization is connected to a control source V4.

Figure 5:
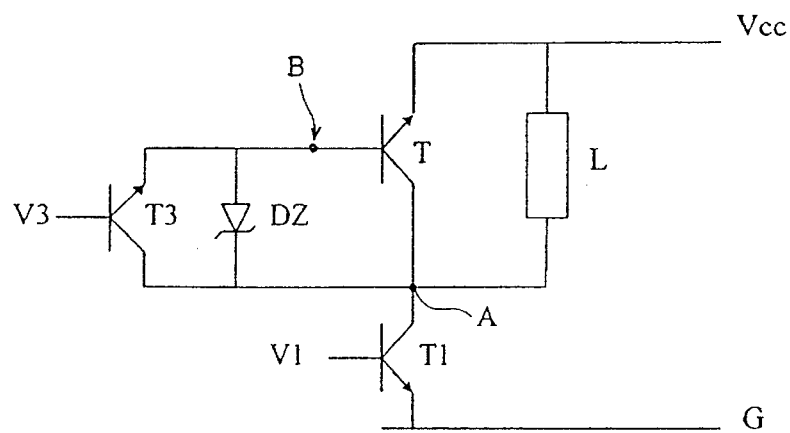
FIG. 5 represents an alternative to the circuit of FIG. 3 in which all the switches are bipolar transistors.

FIG. 5 represents an alternative embodiment of the circuit of FIG. 3 in which all the switches are fabricated in the form of bipolar transistors. Thus the switches S1 and S3 of FIG. 3 are represented in the form of NPN transistors T1 and T3.

Figure 6:
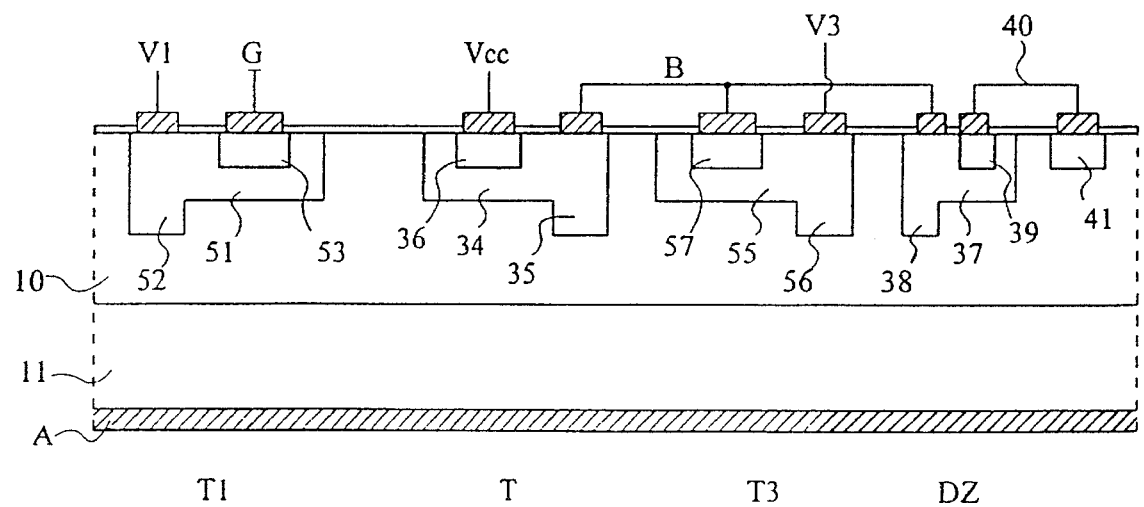
FIG. 6 represents a schematic and simplified cross-sectional view of a component implementing the circuit of FIG. 5.

FIG. 6 is a schematic cross-sectional view of a component implementing the circuit of FIG. 5. In FIG. 5, the layers, regions and wells identical to those of FIG. 4 are designated with the same references. In particular, the elements constituting the transistor T and the zener diode DZ are the same as in FIG. 4. The lateral MOS transistor corresponding to switch S4 is not represented but can also be provided.

The NPN transistor T1 is vertically disposed and comprises a base region 51, 52 and an emitter region 53. The emitter region is connected to the external terminal G and the base region is connected to the control voltage V1.

The NPN transistor T3 is vertically disposed and comprises a base region 55, 56 and an emitter region 57. The emitter region is connected to terminal B and the base region is connected to the control voltage V3.

Those skilled in the art will be capable of selecting the disposition and the relative surface of the various regions and the number of cells of the MOS transistors to comply with the desired requirements of current flow. In addition, the various usual modifications made to the considered technology can be implemented to fabricate a component according to the present invention.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A semiconductor component for switching an inductive load, comprising:
   first and second external terminals, first and second control terminals, and a node;
   a vertical bipolar transistor having a base region and being disposed between the first external terminal and said node;
   a first vertical transistor disposed between said node and the second external terminal; and
   a zener diode and a second vertical transistor connected in parallel between the base of said vertical bipolar transistor and said node.

2. The semiconductor component of claim 1, wherein the first and second vertical transistors are MOS transistors.

3. The semiconductor component of claim 1, further comprising a lateral MOS transistor having a gate that receives a third control voltage, a source, connected to the second external terminal, and a drain connected to the base of the vertical bipolar transistor.

4. The semiconductor component of claim 2, further comprising, on the upper surface of an N-type substrate having a rear surface coated with a highly doped N-type region and a metallization:
   cells of said first vertical MOS transistor, having a source connected to the second external terminal and a gate connected to the first control voltage;
   cells of said second vertical MOS transistor, whose gate receives a control voltage;
   an emitter region of said vertical bipolar transistor, the emitter region being connected to the first external terminal and the base region of said vertical bipolar transistor being connected to the source of the cells of said second vertical MOS transistor;
   a P-type well connected to the base region of said vertical bipolar transistor; and
   an N-type cathode region formed in the P-type well, wherein said cathode region is connected to a substrate voltage of the N-type substrate and forms a zener diode in the well.

5. The semiconductor component of claim 4, wherein said cathode region is connected through a metallization to said highly doped N-type region formed in the substrate.

6. The semiconductor component of claim 4, comprising a lateral MOS transistor formed in an additional well disposed in the substrate, the source of said lateral MOS transistor being connected to the second external terminal and its drain being connected to the base of the vertical bipolar transistor.

7. The semiconductor component of claim 1, wherein said first and second vertical transistors are bipolar transistors, said component further comprising, on the upper surface of an N-type substrate, having a rear surface that is coated with a highly doped N-type region and with a metallization:
   a base region and an emitter region of said first vertical bipolar transistor, the emitter region being connected to the second external terminal,
   a base region and an emitter region of said second vertical bipolar transistor,
   an emitter region of said vertical bipolar transistor, the emitter region being connected to the first external terminal and the base region being connected to the emitter region of the second bipolar transistor,
   a P-type well connected to the base region of said vertical bipolar transistor, and an N-type cathode region formed in the P-type well connected to a substrate voltage of the N-type substrate, and forming a zener diode.

8. The semiconductor component of claim 7, wherein the cathode region is connected through a metallization to said highly doped N-type region formed in the substrate.

9. The semiconductor component of claim 7, comprising a lateral MOS transistor formed in an additional well disposed in the substrate, the source of said lateral MOS transistor being connected to the second external terminal and its drain being connected to the base of said vertical bipolar transistor.

10. A method of switching an inductive load, comprising the steps of:

recirculating the current in the load after an excitation phase, the recirculating current flowing through a first switch and the base emitter junction of a transistor; and demagnetizing said load, wherein said first switch is open and the load current during said demagnetizing step flows through said transistor until said load is demagnetized.

11. The method of claim 10, wherein during said excitation phase the load current flows through a second switch to ground.

12. The method of claim 11, wherein during said recirculating step, said second switch is open and said first switch is closed.

13. The method of claim 12, wherein during said demagnetizing step, said first and second switches are both open, and the base current of said transistor flows through a zener diode.

14. The method of claim 13, wherein said first and second switches are one of vertical MOS transistors and bipolar transistors.

15. The method of claim 14 wherein the circuit components used to accomplish said method are fabricated as a semiconductor monolithic component.

16. A circuit for switching an inductive load comprising:

a transistor connected in parallel to the load for recirculating and demagnetizing said load;

a first switch for rendering said transistor conductive when said load is recirculating;

a zener diode for rendering said transistor conductive when said load is demagnetizing; and a second switch for passing the load current to ground during an excitation phase.

17. The circuit of claim 16, said circuit being fabricated as a semiconductor monolithic component.

18. The circuit of claim 17, wherein said first and second switches are off during demagnetization of said load.

19. The circuit of claim 18, wherein said first and second switches are one of vertical MOS transistors and bipolar transistors.

20. The circuit of claim 19, further comprising a third switch, connected to the base of said transistor, for fixing the base potential of the transistor when said load is demagnetized.

* * * * *